United States Patent
Dunn et al.

(10) Patent No.: US 8,693,185 B2
(45) Date of Patent: Apr. 8, 2014

(54) SYSTEM AND METHOD FOR MAINTAINING A CONSISTENT TEMPERATURE GRADIENT ACROSS AN ELECTRONIC DISPLAY

(75) Inventors: William Dunn, Alpharetta, GA (US); Chris Tran, Alpharetta, GA (US); Tim Hubbard, Alpharetta, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 161 days.

(21) Appl. No.: 12/952,745

(22) Filed: Nov. 23, 2010

(65) Prior Publication Data

US 2012/0026432 A1 Feb. 2, 2012

Related U.S. Application Data

(63) Continuation-in-part of application No. 12/641,468, filed on Dec. 18, 2009, now Pat. No. 8,654,302, and a continuation-in-part of application No. 12/411,925, filed on Mar. 26, 2009, and a continuation-in-part of application No. 12/556,029, filed on Sep. 9, 2009, now Pat. No. 8,373,841, and a continuation-in-part of application No. 12/620,330, filed on Nov. 17, 2009, now Pat. No. 8,274,622, and a continuation-in-part of application No. 12/706,652, filed on Feb. 16, 2010, now Pat. No. 8,358,397, and a continuation-in-part of application No. 12/630,469, filed on Dec. 3, 2009, now Pat. No. 8,497,972, and a continuation-in-part of application No. 12/618,104, filed on Nov. 13, 2009, now Pat. No. 8,310,824, and a continuation-in-part of application No. 12/905,704, filed on Oct. 15, 2010, and a continuation-in-part of application No. 12/753,298, filed on Apr. 2, 2010, now Pat. No. 8,351,014.

(60) Provisional application No. 61/321,364, filed on Apr. 6, 2010, provisional application No. 61/138,736, filed on Dec. 18, 2008, provisional application No. 61/039,454, filed on Mar. 26, 2008, provisional application No. 61/095,615, filed on Sep. 9, 2008, provisional application No. 61/115,333, filed on Nov. 17, 2008, provisional application No. 61/152,879, filed on Feb. 16, 2009, provisional application No. 61/252,295, filed on Oct. 16, 2009.

(51) Int. Cl.
*H05K 7/20* (2006.01)
*H05K 5/00* (2006.01)

(52) U.S. Cl.
USPC ...... 361/679.48; 361/689; 361/690; 361/694; 361/695; 165/80.3; 454/184

(58) Field of Classification Search
None
See application file for complete search history.

(56) References Cited

U.S. PATENT DOCUMENTS 5,818,694 A * 10/1998 Daikoku et al. ............. 361/703
5,869,919 A 2/1999 Sato (Continued)

FOREIGN PATENT DOCUMENTS

GB 2402205 1/2004
JP 200829274 12/2008

(Continued)

*Primary Examiner* — Boris Chervinsky
(74) *Attorney, Agent, or Firm* — Standley Law Group LLP

(57) ABSTRACT

An electronic display which can be mounted above a paved surface in an outdoor environment. A surface or plate is placed behind the electronic display to define a gap where cooling air can be drawn through said gap in order to cool the electronic display. A plurality of ribs may be placed within the gap and in thermal communication with the electronic display. The density of the ribs may be varied according to the inlet and exhaust openings for the cooling air. The ribs may be placed at a higher density near the exhaust to account for the increase in temperature of the cooling air as it travels through the gap.

20 Claims, 4 Drawing Sheets

(56) References Cited

U.S. PATENT DOCUMENTS

| | | | |
|---|---|---|---|
| 5,991,153 A * | 11/1999 | Heady et al. | 361/704 |
| 6,833,992 B2 * | 12/2004 | Kusaka et al. | 361/699 |
| 7,059,757 B2 | 6/2006 | Shimizu | |
| 7,083,285 B2 | 8/2006 | Hsu | |
| 7,209,349 B2 * | 4/2007 | Chien et al. | 361/679.46 |
| 7,284,874 B2 | 10/2007 | Jeong et al. | |
| 7,457,113 B2 * | 11/2008 | Kumhyr et al. | 361/679.48 |
| 7,480,140 B2 * | 1/2009 | Hara et al. | 361/692 |
| 7,667,964 B2 * | 2/2010 | Kang et al. | 361/692 |
| 7,800,706 B2 * | 9/2010 | Kim et al. | 349/58 |
| 7,995,342 B2 * | 8/2011 | Nakamichi et al. | 361/696 |
| 8,081,465 B2 * | 12/2011 | Nishiura | 361/703 |
| 8,223,311 B2 * | 7/2012 | Kim et al. | 349/161 |
| 8,254,121 B2 * | 8/2012 | Lee et al. | 361/695 |
| 8,270,163 B2 * | 9/2012 | Nakamichi et al. | 361/695 |
| 8,274,789 B2 * | 9/2012 | Nakamichi et al. | 361/688 |
| 2005/0213950 A1 | 9/2005 | Yoshimura | |
| 2006/0082271 A1 | 4/2006 | Lee et al. | |
| 2006/0132699 A1 | 6/2006 | Cho | |
| 2006/0199514 A1 | 9/2006 | Kimura | |
| 2007/0019419 A1 | 1/2007 | Hafuka et al. | |
| 2007/0140671 A1 | 6/2007 | Yoshimura | |
| 2011/0019363 A1 * | 1/2011 | Vahlsing et al. | 361/695 |
| 2011/0075361 A1 * | 3/2011 | Nakamichi et al. | 361/695 |
| 2012/0014063 A1 * | 1/2012 | Weiss | 361/697 |
| 2012/0255704 A1 * | 10/2012 | Nakamichi | 165/11.1 |

FOREIGN PATENT DOCUMENTS

| | | |
|---|---|---|
| KR | 20060016469 | 2/2006 |
| KR | 100666961 | 1/2007 |
| WO | WO2005079129 | 8/2005 |

* cited by examiner

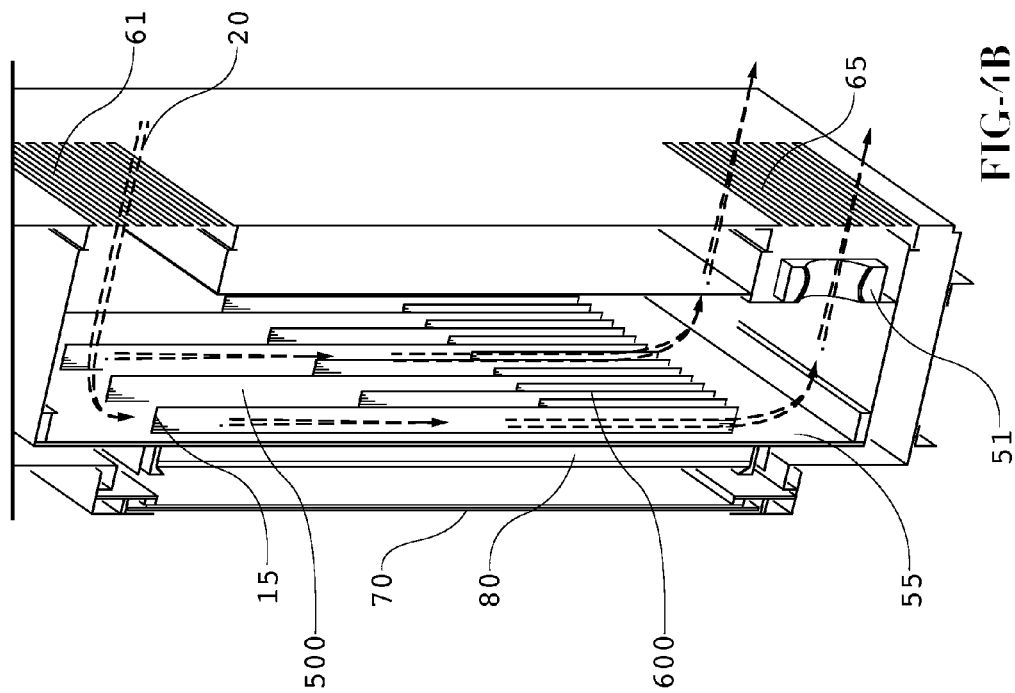
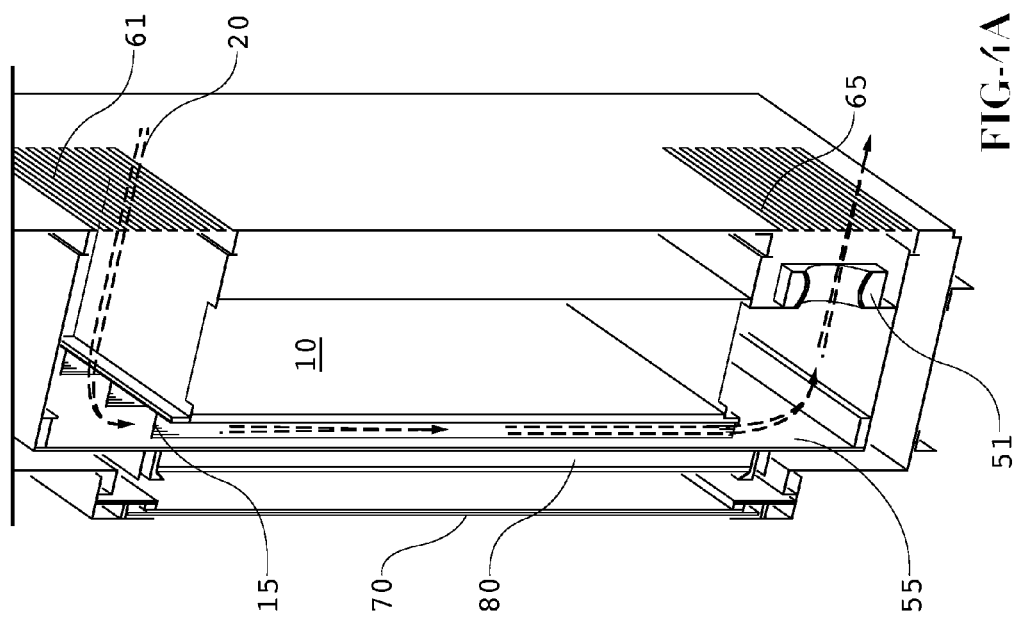

SYSTEM AND METHOD FOR MAINTAINING A CONSISTENT TEMPERATURE GRADIENT ACROSS AN ELECTRONIC DISPLAY

CROSS-REFERENCE TO RELATED APPLICATIONS

This application is a non-provisional of U.S. Application No. 61/321,364 filed Apr. 6, 2010 and is hereby incorporated by reference as if fully cited herein. This application is a continuation in part of U.S. application Ser. No. 12/641,468 filed Dec. 18, 2009 which is a non-provisional of U.S. Application No. 61/138,736 filed Dec. 18, 2008 each of which is hereby incorporated by reference as if fully cited herein. This application is a continuation in part of U.S. application Ser. No. 12/411,925 filed Mar. 26, 2009, which is a non-provisional application of U.S. provisional application No. 61/039,454 filed Mar. 26, 2008 each of which are hereby incorporated by reference as if fully cited herein. This application is a continuation-in-part of U.S. application Ser. No. 12/556,029 filed Sep. 9, 2009, which is a non-provisional application of U.S. provisional application No. 61/095,615 filed Sep. 9, 2008 each of which are hereby incorporated by reference as if fully cited herein. This application is a continuation-in-part of U.S. application Ser. No. 12/620,330 filed Nov. 17, 2009, which is a non-provisional of U.S. Application No. 61/115,333 filed Nov. 17, 2008 each of which are hereby incorporated by reference in their entirety as if fully cited herein. This application is a continuation-in-part of U.S. application Ser. No. 12/706,652 filed Feb. 16, 2010, which is a non-provisional application of U.S. provisional application 61/152,879 filed Feb. 16, 2009 each of which are hereby incorporated by reference as if fully cited herein. This application is a continuation-in-part of U.S. application Ser. No. 12/630,469 filed Dec. 3, 2009 and is hereby incorporated by reference as if fully cited herein. This application is a continuation-in-part of U.S. application Ser. No. 12/618,104 filed Nov. 13, 2009 and is hereby incorporated by reference as if fully cited herein. This application is a continuation-in-part of U.S. application Ser. No. 12/905,704 filed Oct. 15, 2010, which is a non-provisional of U.S. Application No. 61/252,295 filed Oct. 16, 2009 each of which are hereby incorporated by reference in their entirety as if fully cited herein. This application is a continuation-in-part of U.S. application Ser. No. 12/753,298 filed Apr. 2, 2010 and is hereby incorporated by reference as if fully cited herein.

TECHNICAL FIELD

Exemplary embodiments generally relate to cooling systems and in particular to cooling systems for electronic displays.

BACKGROUND OF THE ART

Improvements to electronic displays now allow them to be used in outdoor environments for informational, advertising, or entertainment purposes. While displays of the past were primarily designed for operation near room temperature, it is now desirable to have displays which are capable of withstanding large surrounding environmental temperature variations. For example, some displays are capable of operating at temperatures as low as −22 F and as high as 113 F or higher. When surrounding temperatures rise, the cooling of the internal display components can become even more difficult.

Additionally, modern displays have become extremely bright, with some backlights producing 1,000-2,000 nits or more. Sometimes, these illumination levels are necessary because the display is being used outdoors, or in other relatively bright areas where the display illumination must compete with other ambient light. In order to produce this level of brightness, illumination devices (ex. LED, organic LED, light emitting polymer (LEP), organic electro luminescence (OEL), and plasma assemblies) may produce a relatively large amount of heat.

Still further, in some situations radiative heat transfer from the sun through a front display surface can also become a source of heat. In some locations 800-1400 Watts/$m^2$ or more through such a front display surface is common. Furthermore, the market is demanding larger screen sizes for displays. With increased electronic display screen size and corresponding front display surfaces, more heat will be generated and more heat will be transmitted into the displays.

Given the well-known thermodynamic property that cool air falls and hot air rises, it was previously thought that the best way to cool an electronic display was to ingest the cool air which is found near the bottom of the display. Ingesting the warm air near the top of the display as the cooling air did not seem to make thermodynamic sense. While the air near the bottom of the display is sometimes cooler than the air near the top of the display, it was found that this is not always the case. Especially in applications where the display is mounted on a sidewalk or paved environment, heat was found to emanate from the pavement and cause the air near the bottom of the display to have a higher temperature than the air found at the top. Further, the environment near the bottom of the display was found to contain various contaminates such as dirt, dust, water, leaves, and even garbage/waste materials. These contaminates can have an adverse effect on the display if ingested or clogging up the cooling air intake.

Also, when cooling air was used to cool the rear portion of an electronic display (sometimes an LED backlight or LED display) it was found that the area where the cooling air was ingested was maintained at a cooler temperature than the area where the cooling air was exhausted. Temperature variations across an electronic display may be undesirable as they can alter the optical performance of the electronic display. Some components perform differently when subjected to different ambient temperatures. Thus, with temperature variations across an electronic display there can be visible variations in the image generated by the electronic display.

SUMMARY OF THE EXEMPLARY EMBODIMENTS

An exemplary electronic display may be placed in thermal communication with a plurality of thermally conductive ribs where the ribs are placed in the path of cooling air. The heat from the electronic display is distributed throughout the ribs and removed by the cooling air. It has been discovered that forcing air through the relatively narrow channels defined by the ribs improves the ability to remove heat from the electronic display.

For example, and not by way of limitation, LED arrays are commonly used as the illumination devices for LCD displays. As mentioned above, it has been found that the optical properties of LEDs (and other illumination devices) can vary depending on temperature. Thus, when an LED is exposed to room temperatures, it may output light with a certain luminance, wavelength, and/or color temperature. However, when the same LED is exposed to high temperatures, the luminance, wavelength, color temperature, and other properties can vary. Thus, when a temperature variation occurs across an LED backlight (some areas are at a higher temperature than others) there can be optical inconsistencies across the backlight which can be visible to the observer. By using the embodiments herein, heat buildup can be evenly distributed across the ribs and removed from the display. This can prevent any potential 'hot spots' in the backlight which may become visible to the observer because of a change in optical properties of the illumination devices (sometimes LEDs). OLED assemblies are also known to vary performance when temperatures vary. These types of displays can also be adequately cooled with the embodiments herein.

The ribs may provide an isolated chamber from the rest of the display so that ambient air can be ingested and used to cool the ribs. This is beneficial for situations where the display is being used in an outdoor environment and the ingested air may contain contaminates (pollen, dirt, dust, water, smoke, etc.) that would damage the sensitive electronic components of the display. While an exemplary embodiment could accept some contaminates, it may still be desirable to limit the amount of contaminates that could be ingested into the display. Thus, some embodiments ingest cooling air from the top of the display. The air near the top of the display has been found to occasionally contain less contaminates than the air at the bottom of the display. Still further, in some applications where the display is mounted in a paved location, heat can radiate from the paved surface below and cause the air near the top of the display to actually be cooler than the air near the bottom of the display. In these situations it might make thermodynamic sense to ingest air from the top of the display.

When ingesting air from the top, it has been found that as the cooling air travels across the rear portion of the electronic display and accepts heat it increases in temperature. Once the cooling air reaches the bottom of the display, it may have increased in temperature substantially and may no longer provide adequate cooling to the bottom portion of the display. Therefore, some embodiments vary the density of the thermally conductive ribs so that a consistent temperature gradient can be achieved across the electronic display. Because the bottom portion is typically warmer, the ribs may be at a higher density in the bottom portion to account for this variation.

If a backlight is used with the particular display application, a backlight with front and rear sides may be used where the front side contains the illumination devices and the rear side contains a thermally conductive surface for dissipating the heat from the illumination devices. Ideally, there should be a low level of thermal resistance between the front and rear sides of the backlights. An exemplary embodiment that requires a backlight may use a metal core PCB with LEDs on the front side and a metallic surface on the rear side.

The foregoing and other features and advantages will be apparent from the following more detailed description of the particular embodiments of the invention, as illustrated in the accompanying drawings.

BRIEF DESCRIPTION OF THE DRAWINGS

A better understanding of an exemplary embodiment will be obtained from a reading of the following detailed description and the accompanying drawings wherein identical reference characters refer to identical parts and in which:

FIG. 4A is a perspective section view of an embodiment showing a path for the cooling air.

FIG. 4B is a perspective section view of the embodiment of FIG. 4A where the rear plate has been removed so that the variation in rib density can be observed.

DETAILED DESCRIPTION

Figure 1:
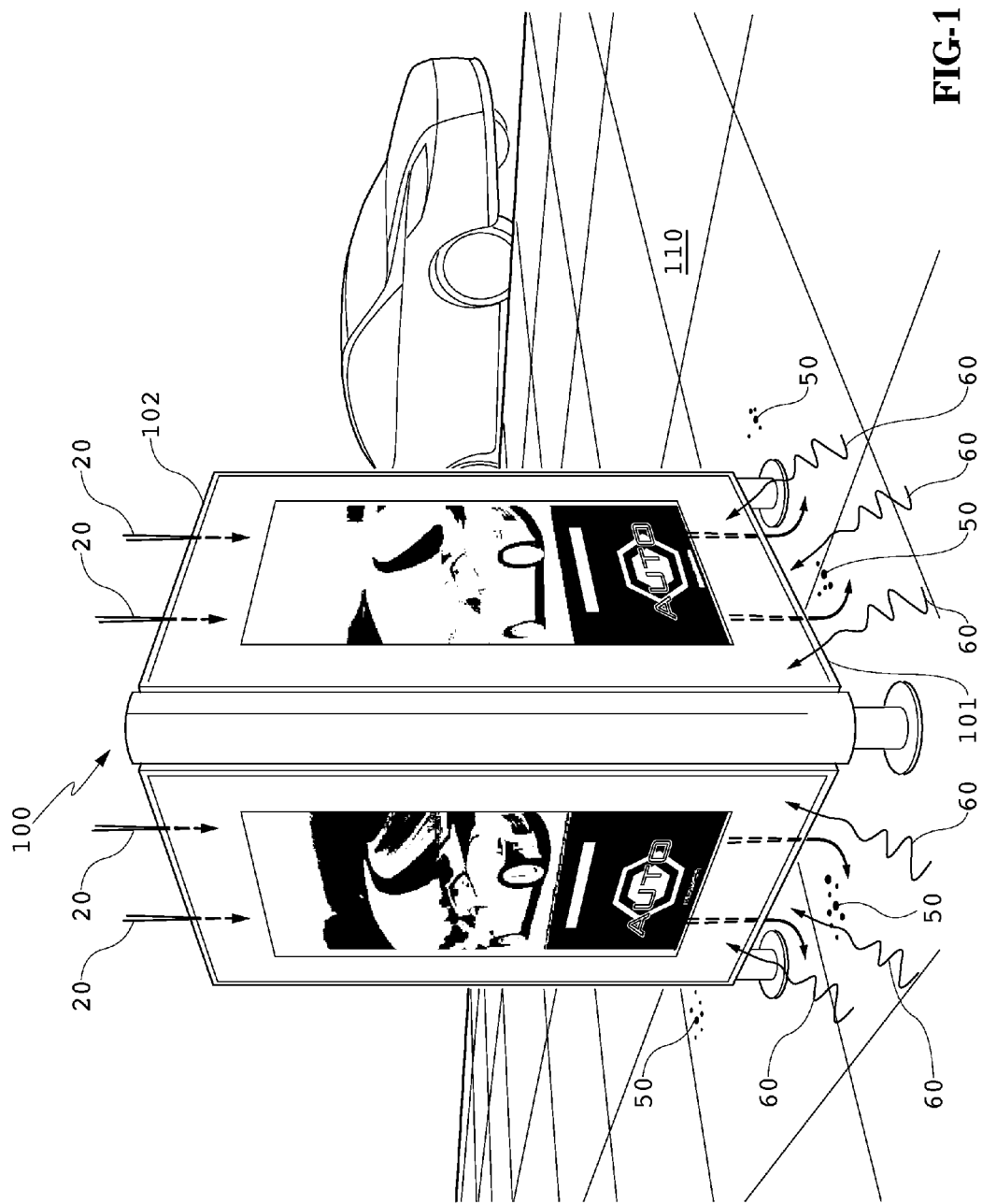
FIG. 1 is a perspective view of an exemplary embodiment mounted in a paved environment.

FIG. 1 provides a perspective view of an exemplary embodiment of an electronic display 100 mounted on a paved outdoor surface 110. Contaminates 50 may be present on the paved outdoor surface 110 and if the display 100 were to ingest air from the bottom 101, these contaminates 50 would likely be ingested into the display 100. Further, heat 60 is shown radiating from the paved outdoor surface 110. If the display 100 were to ingest air from the bottom 101 it would also likely be warmer than the heat near the top 102 because of the radiating heat 60 from the paved outdoor surface 110.

Thus, the embodiment shown ingests air from the top 102 of the display 100 so that the bulk of the contaminates 50 can be avoided. An opening may be located along the top 102 of the display, preferably along the top horizontal surface of the display 100 housing. Another opening may be located along the bottom 101 horizontal surface. Further, the cooling air 20 can sometimes enter the display 100 at a lower temperature at the top 102 than air which is present near the bottom 101 of the display 100. While this may seem counter-intuitive based on the laws of thermodynamics, acceptable results have been observed.

Figure 2:
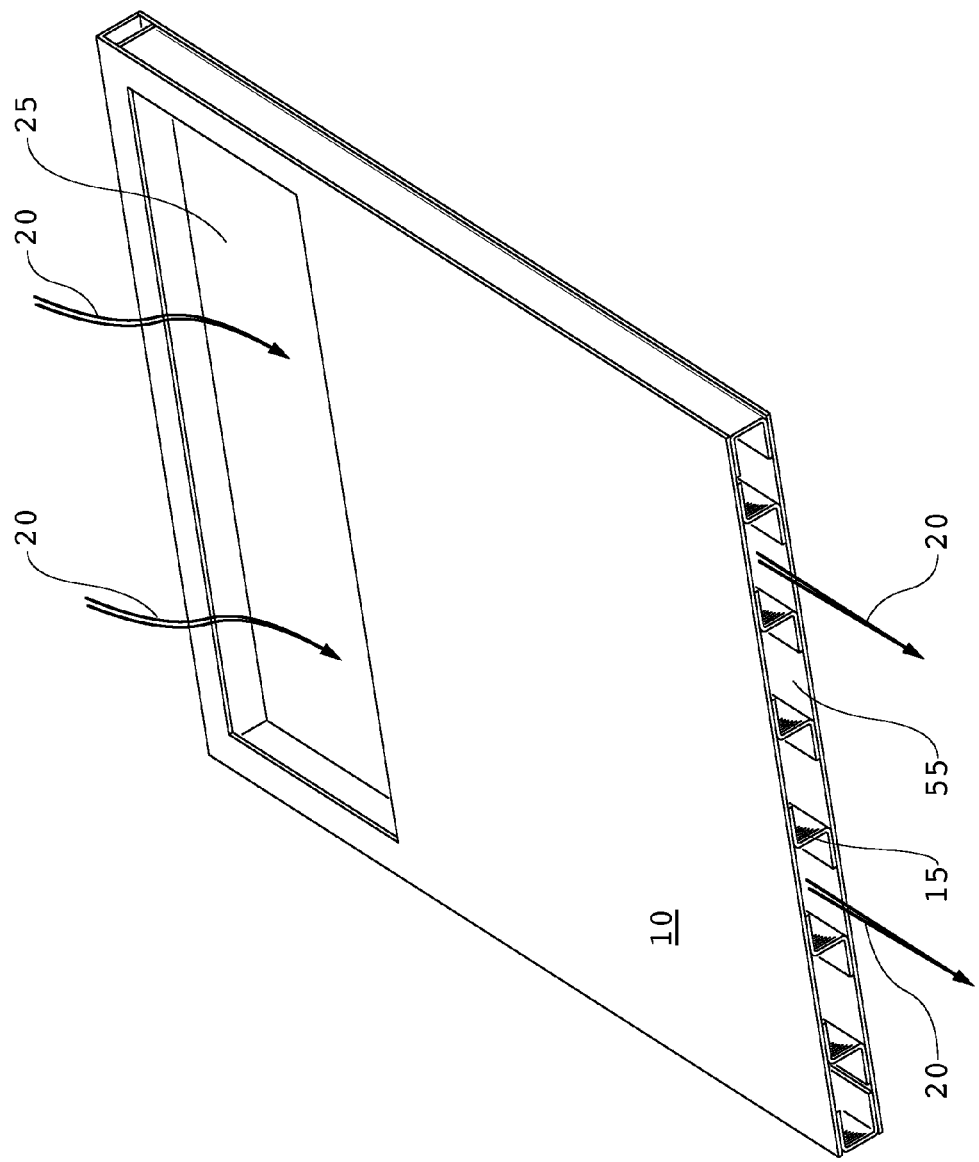
FIG. 2 is a rear perspective section view of an exemplary set of thermally-conductive ribs and the air inlet aperture.

FIG. 2 provides a sectional view of an exemplary embodiment for thermally-conductive ribs 15, which may be sandwiched in between a front plate 55 (preferably thermally conductive) and a rear plate 10. Preferably, the ribs 15 are in thermal communication with the front plate 55. The front plate 55 may be in thermal communication with the electronic display or electronic image assembly (not shown) so that heat from the electronic display can flow to the front plate 55 and into the ribs 15. Due to the thermally-conductive nature of the ribs 15 and the thermal communication between the front plate 55 and the ribs 15, heat which is present within the electronic display may be removed by the ribs 15. In an exemplary embodiment, a path of cooling air 20 is used to remove the heat which has accumulated on the ribs 15.

In an exemplary embodiment, the plate 10 would provide a gaseous and contaminate barrier between the side containing the ribs 15 and the opposing side (which may house various electronic assemblies). If the plate 10 provides an adequate barrier, ambient air may be ingested as cooling air 20 and the risk of contaminates entering the side of the plate 10 containing the sensitive electronic components may be reduced or eliminated. In a similar exemplary embodiment, the front plate 55 would also provide a gaseous and contaminate barrier between the side containing the ribs 15 and the opposing side which may be in thermal communication with the electronic display. This figure also provides one example of an inlet aperture 25 which accepts the cooling air 20 and directs it along the ribs 15. The cooling air 20 may not only remove heat from the ribs 15 but may also remove it from the front plate 55 and optionally the rear plate 10.

The ribs 15 shown in this embodiment contain a 'Z' cross-section, but this is not required. Other embodiments may contain ribs with I-beam cross-sections, hollow square cross-sections, hollow rectangular cross-section, solid rectangular or solid square cross-sections, 'T' cross-sections, a honeycomb cross-section, or any combination or mixture of these.

Figure 3:
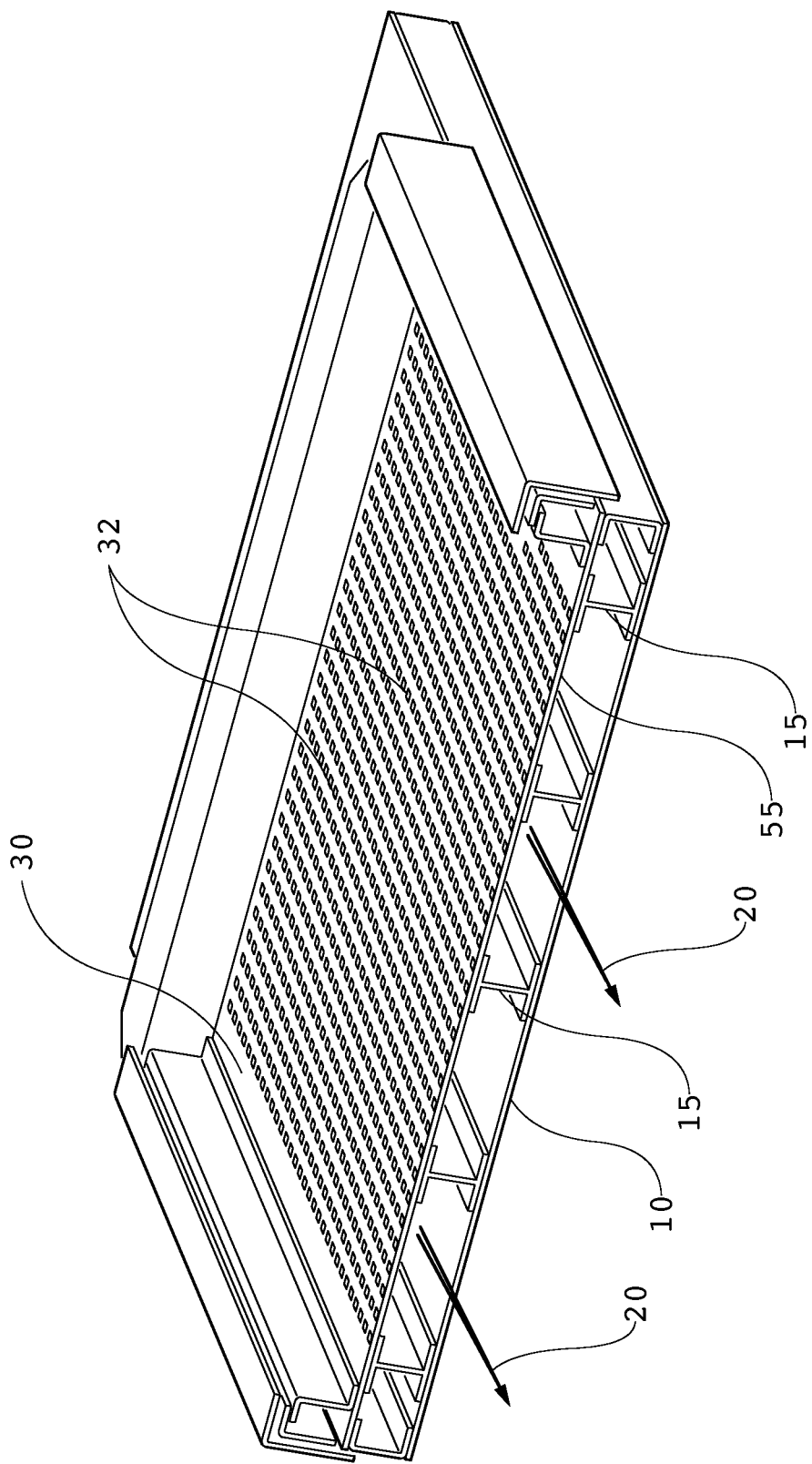
FIG. 3 is a front perspective section view of an embodiment for cooling a backlight with thermally-conductive ribs.

FIG. 3 shows a front perspective section view of an embodiment for cooling a backlight with thermally-conductive ribs 15. The backlight assembly in this embodiment includes a plurality of illumination devices 32 which are mounted on a thermally conductive substrate 30. In an exemplary embodiment, the illumination devices 32 would be LEDs and the thermally conductive substrate 30 would be a PCB and more preferably a metal core PCB. On the surface of the thermally conductive substrate 30 which faces the ribs 15 there may be a thermally conductive front plate 55. In an exemplary embodiment, the thermally conductive front plate 55 would be metallic and more preferably aluminum. It is preferred that the ribs 15 are in thermal communication with the thermally conductive plate 55 and that the thermally conductive plate 55 is in thermal communication with the thermally conductive substrate 30. In some embodiments however, the thermally conductive substrate 30 may comprise traditional PCB materials rather than a metal core PCB or highly thermally conductive materials. It is preferable that there is a low level of thermal resistance between the illumination devices 32 and the ribs 15. Cooling air 20 may again be forced along the ribs 15 in order to remove heat absorbed from the backlight assembly.

As noted above, many illumination devices (especially LEDs and OLEDs) may have performance properties which vary depending on temperature. When 'hot spots' are present within a backlight or illumination assembly, these hot spots can result in irregularities in the resulting image which might be visible to the end user. Thus, with the embodiments described herein, the heat which may be generated by the backlight assembly can be distributed (somewhat evenly) throughout the various ribs and thermally-conductive surfaces to remove hot spots and cool the backlight and/or electronic display.

In a further exemplary embodiment, the ribs 15 can also be used to cool additional electronic assemblies by placing them in thermal communication with the rear plate 10. Thus, with the ribs 15 in a central location, the 'front' would be towards an intended observer of the display while the 'back' would be on the opposite side of an intended observer. Therefore, the front side of the ribs 15 would be in thermal communication with some portion of the electronic display assembly and the rear side of the ribs may be in thermal communication with a rear plate 10 (possibly being thermally-conductive). A single path of cooling air can then be used to cool the interior of the display while the various hot spots can distribute heat throughout the ribs and other thermally conductive surfaces to provide the most efficient cooling.

FIG. 4A is a perspective section view of an embodiment showing a path for the cooling air 20 through the inlet 61 and exhaust 65 apertures. One or more fans 51 may be used to draw the air 20 into the inlet aperture 61 and through the ribs 15. Although shown at the bottom of the display near the exhaust aperture 65, the fans 51 may be placed anywhere within the display so that an adequate flow of cooling air 20 is supplied. Thus, although shown in the figure as 'pulling' the cooling air 20 through the ribs 15, other embodiments may 'push' the cooling air 20 instead. Still further, some embodiments may 'push' and 'pull' the cooling air 20. In some embodiments, the air 20 may be air conditioned before it is directed along the ribs 15. In some embodiments, the air 20 may be filtered before it is directed along the ribs 15 in order to remove contaminates. In the embodiment shown, thermally conductive front plate 55 is in thermal communication with the front side of the ribs 15. Preferably, the front plate 55 is also in thermal communication with the electronic display image assembly 80, which could be but is not limited to any of the following: liquid crystal display (LCD), OLED, plasma display assembly, light emitting polymer (LEP) assembly, organic electro luminescence (OEL) assembly, or LED display assembly.

The front plate 55 may be the rear surface of an OLED assembly or the rear surface of an LED backlight assembly for an LCD. A front protective glass 70 is used to protect the electronic display image assembly 80 from damage. Solar loading (radiative heat transfer from the sun through the front protective glass 70) may result in a heat buildup on the electronic display image assembly 80. Thermal communication between the electronic display image assembly 80 and the front plate 55 can provide a means for transferring the solar loading (and any other heat buildup) on the electronic display image assembly 80 to the ribs 15, cooling air 20, and out of the display through the exhaust aperture 65. The front plate 55 can also be the rear surface of any backlight assembly, plasma display assembly, light emitting polymer (LEP) assembly, organic electro luminescence (OEL) assembly, or LED display assembly.

FIG. 4B is a perspective section view of the embodiment of FIG. 4A where the rear plate 10 has been removed so that the optional variation of density in the ribs 15 can be observed. As mentioned above, as cooling air 20 enters the inlet aperture 61 the temperature of the air is relatively low and its ability to cool the upper portion 500 of the display is relatively good. However, as the cooling air 20 travels through the ribs 15, more heat is absorbed by the cooling air 20 and thus raises the temperature of the cooling air 20. Therefore, once cooling air 20 reaches the lower portion 600 of the display, it has risen in temperature and is no longer as effective at removing heat from the ribs 15, electronic image assembly 80, front plate 55, and possibly even the rear plate 10. If heat is not removed at the lower portion 600 in a similar amount as the top portion 500, there may be a temperature variance between the top of the display and the bottom of the display. As discussed above, a variation in temperature across the display can sometimes cause variations in optical properties of various components and a resulting variation of the image.

To counteract this phenomenon, in some embodiments the density of the ribs 15 may optionally be higher in the lower portion 600 than in the upper portion 500 to account for the reduction in heat transfer efficiency due to the higher temperature of the cooling air 20. By providing an increased amount of surface area for the cooling air 20 to contact, heat can be removed from the lower portion 600 (where the cooling air is relatively warm) in a similar amount as the heat removed from the upper portion 500 (where the cooling air 20 is relatively cool). This optional technique can help to balance the temperature across the front plate 55 and thus the electronic image assembly 80 to ensure that the image remains consistent across the display.

It should be noted that although the inlet 61 and exhaust 65 apertures are shown in a vertical orientation on the rear wall (opposite the viewable surface) of the display housing, they can also be placed on the sides of the housing. Alternatively, the inlet aperture 61 may be on the top horizontal surface of the display housing while the exhaust aperture 65 is on the bottom horizontal surface of the display housing.

Although some of the figures herein may show displays which are oriented in a portrait fashion, any orientation can be used with the embodiments described herein. Thus, landscape or widescreen orientations can also be used as well as any type of square orientation.

In some embodiments, the display may not be mounted on a paved surface (or some other object/surface that is radiating heat). In these embodiments, it may be desirable to ingest air from the bottom of the display because this air might be cooler than the air at the top of the display. In this type of design, the variation in rib density may still be used to account for the warming of the cooling air as it travels up the display and exhausts out the top. Here, the top of the display will likely be warmer than the bottom and providing a higher density of ribs near the top of the display can help to balance this thermal irregularity to ensure a consistent image production.

The cooling system may run continuously. However, if desired, temperature sensing devices (not shown) may be incorporated within the electronic display to detect when temperatures have reached a predetermined threshold value. In such a case, the various cooling fans may be selectively engaged when the temperature in the display reaches a predetermined value. Predetermined thresholds may be selected and the system may be configured to advantageously keep the display within an acceptable temperature range. Typical thermostat assemblies can be used to accomplish this task. Thermocouples may be used as the temperature sensing devices.

It is to be understood that the spirit and scope of the disclosed embodiments provides for the cooling of many types of displays. By way of example and not by way of limitation, embodiments may be used in conjunction with any of the following: LCD (all types), light emitting diode (LED), organic light emitting diode (OLED), field emitting display (FED), light emitting polymer (LEP), organic electro luminescence (OEL), and plasma displays. Furthermore, embodiments may be used with displays of other types including those not yet discovered. In particular, it is contemplated that the system may be well suited for use with full color, flat panel OLED displays. Exemplary embodiments may also utilize large (55 inches or more) LED backlit, high definition liquid crystal displays (LCD). While the embodiments described herein are well suited for outdoor environments, they may also be appropriate for indoor applications (e.g., factory/industrial environments, spas, locker rooms) where thermal stability of the display may be at risk.

Having shown and described preferred embodiments, those skilled in the art will realize that many variations and modifications may be made to affect the described embodiments and still be within the scope of the claimed invention. Additionally, many of the elements indicated above may be altered or replaced by different elements which will provide the same result and fall within the spirit of the claimed invention. It is the intention, therefore, to limit the invention only as indicated by the scope of the claims.

We claim:

1. An electronic display assembly comprising:
a housing having top and bottom openings;
an electronic display within the housing;
a plate behind the electronic display, the space between the electronic display and the plate defining a gap; and
a fan positioned to draw cooling air through the top opening, through the gap, and exhausting out of the bottom opening;
wherein the housing permits water vapor from the surrounding environment to enter the housing through the gap but prevents water vapor from the surrounding environment to enter remaining portions of the housing.

2. The electronic display assembly of claim 1 wherein: said electronic display is a liquid crystal display.

3. The electronic display assembly of claim 1 wherein: said fan is placed adjacent to the bottom opening.

4. The electronic display assembly of claim 1 wherein: said electronic display is an LED display.

5. The electronic display assembly of claim 1 wherein: said electronic display is an OLED display.

6. The electronic display assembly of claim 1 further comprising:
a plurality of thermally conductive ribs placed within the gap and in thermal communication with the electronic display.

7. The electronic display assembly of claim 6 wherein: said thermally conductive ribs are metallic.

8. The electronic display assembly of claim 6 wherein: said ribs are placed at a higher density near the bottom of the display housing, and placed at a lower density near the top of the display housing.

9. The electronic display assembly of claim 8 wherein: said ribs have an I beam cross-section.

10. The electronic display assembly of claim 8 wherein: said ribs have a rectangular cross-section.

11. A liquid crystal display assembly comprising:
an LED backlight placed behind a liquid crystal display assembly and having a width;
a surface placed behind and substantially parallel to the LED backlight, the space between the LED backlight and surface defining a gap with an inlet opening and exhaust opening, said inlet opening having a width at least half the size of the width of the LED backlight, said inlet opening accepting ambient air and said exhaust opening exhausting ambient air; and
a plurality of ribs in conductive thermal communication with the LED backlight and placed within said gap, where the density of the ribs near the exhaust opening is greater than the density of ribs near the inlet opening.

12. The liquid crystal display assembly of claim 11 further comprising:
a fan positioned to draw ambient air through said gap.

13. The liquid crystal display assembly of claim 11 further comprising:
a fan positioned to push ambient air through said gap.

14. The liquid crystal display assembly of claim 11 wherein:
the density of the ribs at the exhaust opening is at least twice the density of the ribs at the inlet opening.

15. The liquid crystal display assembly of claim 11 wherein:
the LED backlight comprises a plurality of LEDs mounted on a metal core printed circuit board.

16. The liquid crystal display assembly of claim 15 further comprising:
a metallic surface attached to the rear side of the LED backlight and in conductive thermal communication with the ribs.

17. The liquid crystal display assembly of claim 16 wherein:
the ribs have any one of the following cross-sections: I-beam, hollow square, hollow rectangular, solid rectangular, solid square, 'T', 'Z', and honeycomb.

18. An electronic display assembly comprising:
a housing having a top surface with an opening and bottom surface with an opening;
an electronic display within the housing;
a plate behind the electronic display, the space between the electronic display and the plate defining a gap;
a plurality of thermally conductive ribs placed within the gap and in conductive thermal communication with the electronic display; and
a fan positioned near the opening in the bottom surface to draw cooling air through the gap.

19. The electronic display assembly of claim 18 wherein:
the density of the ribs near the bottom opening is greater than the density of ribs near the top opening.

20. The electronic display assembly of claim 19 wherein:
the electronic display is an LED-backlit liquid crystal display where the LED backlight is in conductive thermal communication with the ribs.

* * * * *